United States Patent
Tu et al.

(10) Patent No.: US 7,632,760 B2
(45) Date of Patent: Dec. 15, 2009

(54) SEMICONDUCTOR DEVICE HAVING FIELD STABILIZATION FILM AND METHOD

(75) Inventors: Shanghui Larry Tu, Phoenix, AZ (US); Takeshi Ishiguro, Aizuwakamatsu (JP); Fumika Kuramae, Aizuwakamatsu (JP); Ryuji Omi, Aizuwakamatsu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 584 days.

(21) Appl. No.: 11/099,895

(22) Filed: Apr. 7, 2005

(65) Prior Publication Data

US 2006/0226479 A1    Oct. 12, 2006

(51) Int. Cl.
*H01L 21/31* (2006.01)
*H01L 21/469* (2006.01)

(52) U.S. Cl. .................. 438/763; 257/341; 257/644
(58) Field of Classification Search .......... 257/341, 257/335, 343, 367, 339, 409, 488, 492, 493, 257/648, 650, 652, 644, 634; 438/763
See application file for complete search history.

(56) References Cited

U.S. PATENT DOCUMENTS

| | | | | |
|---|---|---|---|---|
| 3,343,049 A * | 9/1967 | Barson et al. | ............... | 257/411 |
| 5,294,824 A * | 3/1994 | Okada | ................ | 257/409 |
| 5,883,001 A * | 3/1999 | Jin et al. | ............. | 438/624 |
| 5,953,600 A * | 9/1999 | Gris | ............. | 438/200 |
| 6,015,457 A * | 1/2000 | Leung et al. | ......... | 106/287.16 |
| 6,054,356 A * | 4/2000 | Dawson et al. | ............. | 438/301 |
| 6,177,199 B1 * | 1/2001 | Hacker et al. | ............. | 428/447 |
| 6,319,551 B1 * | 11/2001 | Risen et al. | ............... | 427/226 |
| 6,642,157 B2 * | 11/2003 | Shioya et al. | ............... | 438/789 |
| 2006/0237802 A1 * | 10/2006 | Chen et al. | ............... | 257/408 |

OTHER PUBLICATIONS

Stanley Wolf PhD. et al., "Silicon Processing For the VLSI Era, vol. 1: Process Technology", 2nd Edition, Lattice Press, Copyright 2000, pp. 785-790.

* cited by examiner

*Primary Examiner*—W. David Coleman
*Assistant Examiner*—Sonya D McCall-Shepard
(74) *Attorney, Agent, or Firm*—Kevin B. Jackson

(57) ABSTRACT

In one embodiment, a high voltage semiconductor device is formed with a first dielectric layer and a charge stabilization layer comprising a flowable glass formed over the first dielectric layer.

15 Claims, 3 Drawing Sheets

SEMICONDUCTOR DEVICE HAVING FIELD STABILIZATION FILM AND METHOD

FIELD OF THE INVENTION

This invention relates generally to semiconductor devices, and more specifically to high voltage switching devices and methods of their manufacture.

BACKGROUND OF THE INVENTION

High voltage power semiconductor devices are used in many power conversion and control applications. Such devices include diodes, bipolar transistors, insulated gate bipolar transistors (IGBTs), thyristors, and metal oxide field effect transistors (MOSFETs). At first glance, it would appear that the physics of semiconductor high voltage power devices is identical to their low voltage power counterparts. However, although some features of device operation are similar, many aspects of device physics take on a different sense of importance under conditions of high voltage operation.

In general, high voltage semiconductor devices (i.e., devices capable of withstanding breakdown voltages in excess of 200 volts or more) must be capable of supporting high blocking voltages when in an OFF state, and capable of conducting at high current levels with minimum power dissipation (i.e., low on-resistance) when in an ON state. However, a high blocking voltage and a low on-resistance present two conflicting design parameters that challenge designers and fabricators of high voltage devices.

The reverse breakdown voltage of a diode junction device is determined by, among other things, the resistivity of the p- and n-regions, and by doping profiles. High voltage devices require manufacturers to use high resistivity starting materials and/or regions. By way of example, resistivity values greater than 1 to 3 ohm-cm or more are common for high voltage devices compared to resistivity values of 0.15 to 0.20 ohm-cm for typical integrated circuit devices. The higher resistivity values coupled with evolving design constraints present challenges that make it difficult to produce high voltage power devices that are stable and reliable over time. Such design constraints include smaller device dimensions, multiple levels of metallization, and integration with other sensitive devices (e.g., integrated circuit devices).

Additionally, present methods and structures used for lower voltage devices have been found to be unreliable when used for higher voltage devices. For example, such methods and structures result in devices having breakdown voltage degradation over time, unwanted field inversion effects, and parasitic leakage effects.

Accordingly, improved power semiconductor device structures and methods of their manufacture are needed to address the above mentioned issues as well as others.

DETAILED DESCRIPTION OF A PREFERRED EMBODIMENT

Figure 1:
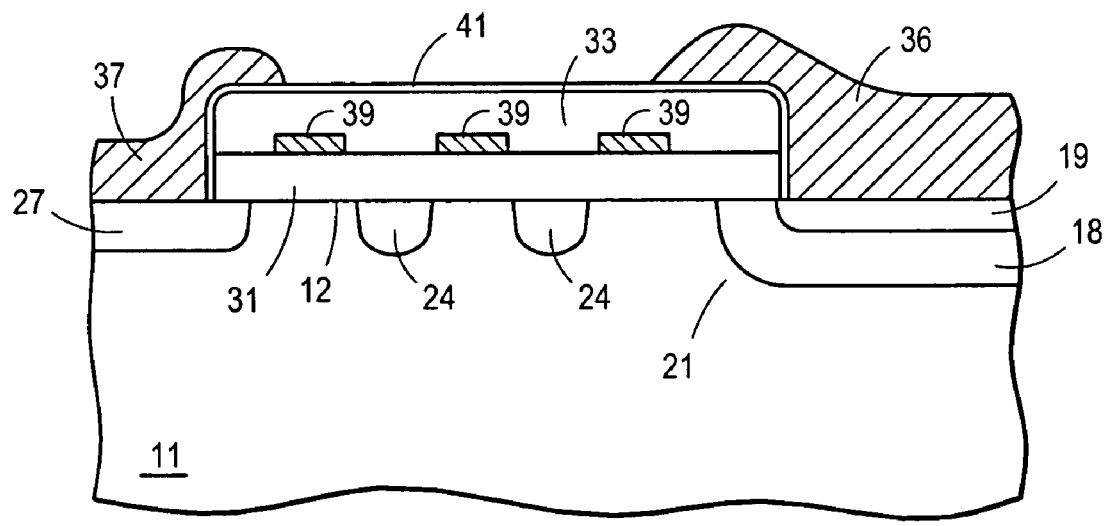
FIG. 1 illustrates a highly enlarged cross-sectional view of a high voltage semiconductor structure in accordance with an embodiment of the present invention.

For ease of understanding, elements in the drawing figures are not necessarily drawn to scale, and like element numbers are used where appropriate throughout the various figures. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles, and are typically rounded. Additionally, descriptions and details of well-known steps and elements are omitted for simplicity of the description. Although the devices are explained herein as certain N-channel devices, a person of ordinary skill in the art will appreciate that P-channel and complementary devices are also possible in accordance with the present invention.

FIG. 1 shows a highly enlarged partial cross-sectional view of a power semiconductor device, high voltage structure, or high voltage power device 10 in accordance with an embodiment of the present invention. By way of example, device 10 is a high voltage diode device, or is a termination portion or other portion of a bipolar transistor, IGBT, thyristor, or MOSFET device where high breakdown fields are present. Device 10 comprises a body of semiconductor material, region, or substrate 11. Body of semiconductor material 11 or portions thereof comprises silicon or a IV-IV (e.g., SiGe, SiC, SiGeC, etc.) semiconductor material, a III-V semiconductor material, or combinations thereof. By way of example, region 11 has a resistivity of about 1 to 10 ohm-cm for a 200 volt device, about 10 to 20 ohm-cm for a 500 volt device, and about 20 to 80 ohm-cm for a 750 volt device.

Device 10 further includes a first doped region 18, which comprises a conductivity type opposite to that of region 11 to form a high voltage junction 21. By way of example, first doped region 18 has a peak concentration of about $1.0 \times 10^{15}$ atoms/cm$^3$ to about $1.0 \times 10^{18}$ atoms/cm$^3$ and a junction depth on the order of about 3 to 30 microns. In an optional embodiment, a second doped region 19 of the same conductivity type as first doped region 18 is formed in first doped region to increase the surface concentration to greater than about $1.0 \times 10^{20}$ atoms/cm$^3$ for improved ohmic contact. In a further embodiment, second doped region 19 comprises an opposite conductivity type to form an emitter, source, or cathode region.

Optional ring regions or electric field spreading regions 24 are formed in portions of region 11, and comprise the same conductivity type as first doped region 18. The number and spacing of ring regions 24 is dependent upon the breakdown voltage of device 10, and these parameters are determined using well known techniques. A third doped or channel stop region 27 is formed at an outer portion of device 10. In one embodiment, third doped region 27 comprises the same conductivity type as region 11.

A first dielectric layer 31 is formed over a major surface 12 of region 11, and comprises for example, a thermally deposited or thermally grown silicon dioxide. By way of example, first dielectric layer 31 has a thickness on the order of 0.5 to 2.0 microns. One problem found with first dielectric layer 31 when it comprises a thermally deposited or thermally grown dielectric is that when device 10 is under a high voltage reverse bias conditions, a resultant electric field at the surface of device 10 produces a charge imbalance or dipole along first dielectric layer 31. The inventors found that this dipole effect causes degradation in the blocking voltage capability of high voltage device 10 during high voltage stress testing or conditions. This effect is magnified because of the low dopant concentration or high resistivity of semiconductor region 11 and the high voltage bias conditions, which are not found with typical low voltage and/or IC devices.

In accordance with the present invention, a charge stabilization, charge neutralizing layer, or glass stabilization layer 33 is formed adjacent (either directly or indirectly), on or over first dielectric layer 31. In a typical embodiment, charge stabilization layer 33 comprises a material having a lower dielectric constant than first dielectric layer 31. For example, charge stabilization layer 33 comprises a silicon glass material that contains a greater amount of SiH content or concentration than the SiH content or concentration in first dielectric layer 31. In one embodiment, charge compensation layer 33 has a refractive index less than about 1.4. In a further embodiment, charge compensation layer 33 has a refractive index between about 1.36 and about 1.38. By way of further example, charge stabilization layer 33 comprises a silicon glass layer having an O—Si—O lattice that is more fragmented or cage like than conventional thermally deposited or thermally grown silicon oxides, which are more network like. In a still further example, charge stabilization layer 33 comprises a silicon glass material that is more porous than conventional thermally deposited or grown silicon oxides. In one embodiment, charge compensation layer 33 comprises a liquid or flowable glass material such as a siloxane, silicate, or hydrogen silsesquioxanes (HSQ) spin-on glass (SOG) or the like. The inventors found that charge compensation layer 33 functions to neutralize or reduce the dipole effect or sweeps away surface charge found in or at the interface of first dielectric layer 31 and major surface 12 or portions thereof when device 10 is exposed to high voltage reverse bias conditions. The inventors found that this significantly improved the stability of the breakdown voltage of device 10. In one embodiment, charge compensation layer 33 extends the length or lateral extent or more of first dielectric layer 31. In the present invention, charge stabilization layer 33 does not consist of silicon nitride or semi-insulating polysilicon (SIPOS).

In a method for forming device 10 when charge compensation layer 33 comprises a liquid or flowable SOG, layer 33 is deposited or spun onto device 10 using a dispense and spin apparatus. After layer 33 is dispensed, it is baked first at low temperature (e.g., 150 to 350 degrees Celsius for 1 to 15 minutes in air), and then at a higher temperature (e.g., 400 to 500 degrees Celsius for 30-60 minutes in inert gas). The solvent present in the liquid SOG is first driven off, and water is evolved from the film. In a typical embodiment, layer 33 has a final thickness in a range from about 0.2 microns to about 1.0 microns. In one embodiment, a second dielectric layer 41 is formed over charge stabilization layer 33, and comprises for example, silicon nitride or a low temperature deposited oxide. By way of example, second dielectric layer 41 has a thickness on the order of about 0.05 to about 0.5 microns.

Device 10 further includes a first conductive layer 36 that is coupled to second doped region 19 and a second conductive layer 37 coupled to third doped region 27. Although not shown an additional conductive layer may be coupled to a lower surface of body of semiconductor material 11. Conductive layers 36 and 37 comprise for example, aluminum, an aluminum alloy, titanium/nickel/silver, chromium/nickel/gold, or the like. In an optional embodiment, third conductive layers 39 are formed on first dielectric layer 31 and over ring regions 24 to provide further field shaping capability. Third conductive layers 39 comprise for example, doped polycrystalline silicon, a metal, or the like.

Figure 2:
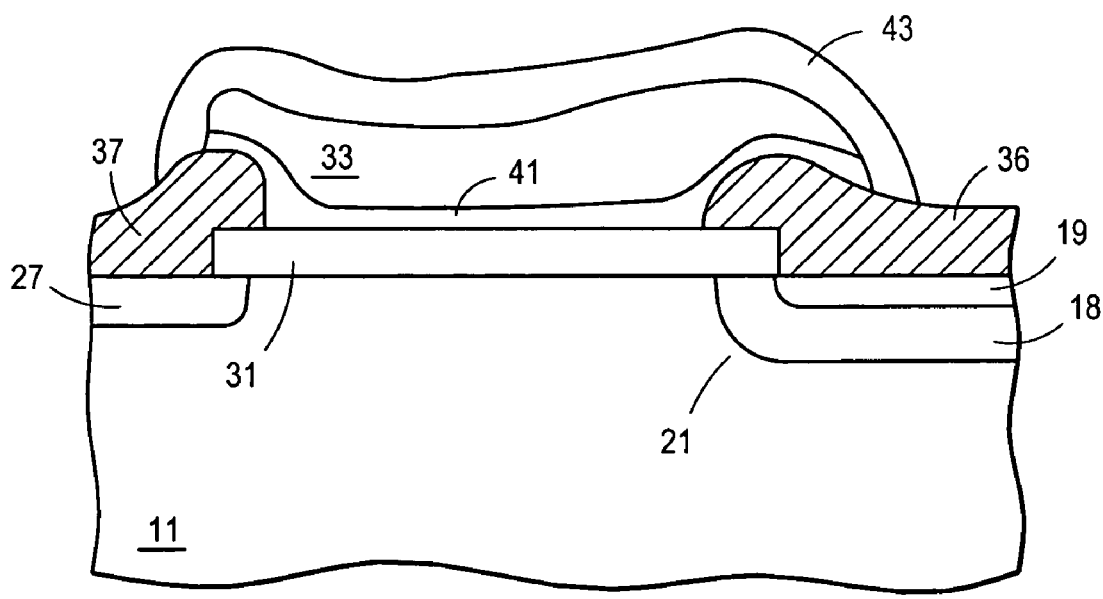
FIG. 2 illustrates a highly enlarged cross-sectional view of a high voltage semiconductor structure in accordance with another embodiment of the present invention.

FIG. 2 shows a highly enlarged partial cross-sectional view of a power semiconductor device, high voltage structure, or high voltage power device 100 in accordance with another embodiment of the present invention. By way of example, device 100 is a high voltage diode device, or is a termination portion or other portion of a bipolar transistor, IGBT, thyristor, or MOSFET device where high breakdown fields are present. Device 100 is similar to device 10 except that charge stabilization layer 33 is deposited as final layer above first and second dielectric layers 31 and 41. Device 100 further includes an optional outer passivation layer 43, which comprises for example, silicon nitride or a thermally deposited oxide. By way of example, layer 43 has thickness of about 0.05 microns to about 1.0 microns. Additionally, device 100 is shown without ring regions 24 or third conductive layers 39, but these features are optionally included in device 100.

Figure 3:
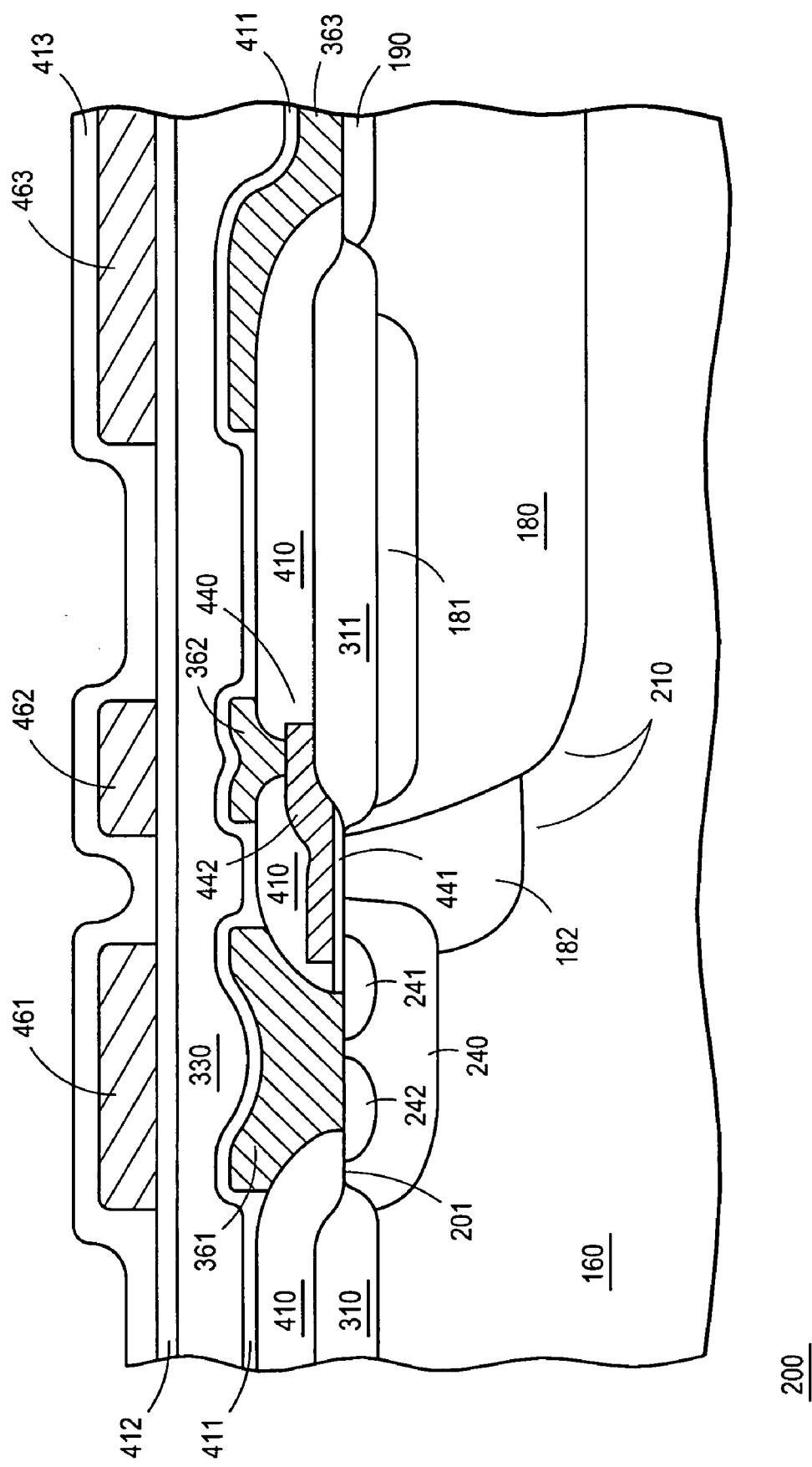
FIG. 3 illustrates a highly enlarged cross-sectional view of a high voltage semiconductor structure in accordance with a further embodiment of the present invention.

FIG. 3 shows a highly enlarged partial cross-sectional view of a power semiconductor device, high voltage structure, or high voltage power device 200 in accordance with a further embodiment of the present invention. In this embodiment, device 200 comprises a high voltage (i.e., greater 200 volts) lateral DMOS or LDMOS device. Device 200 includes a body or region of semiconductor material 160, which comprises for example, a semiconductor substrate or region of a first conductivity type. By way of example when device 200 is an n-channel device, semiconductor region 160 comprises a p-type region, and has a resistivity greater than about 1.0 ohm-cm. As stated previously, the resistivity is selected depending on the desired high voltage breakdown characteristics.

Device 200 further includes a first well, drift, extended drain or doped region 180 formed in a portion of region 160 and extending into region 160 from a major surface 201. By way of example, first well region 180 comprises an n-type region, and has a peak doping concentration of about $1.0 \times 10^{15}$ atoms/cm$^3$, and a depth of about 4 to 10 microns.

In an optional embodiment, one or more p-type layers or p-top layers 181 are formed in well region 180 and extend from major surface 201 to provide a reduced surface field region. Alternatively, p-type layer 181 is a sub-surface region. P-type layers 181 allow for downward depletion when device 200 in a blocking or off state, which allows device 200 to sustain a higher blocking voltage. A heavily doped n-type contact or drain region 190 is formed in first well region 180.

Device 200 further includes a second well, drift, extended drain or doped region 182, which is formed in another portion of region 160 and extends from major surface 201. By way of example, second well region 182 comprises an n-type region, and has a peak doping concentration that is lower than the peak doping concentration of first well region 180. Further, in one embodiment second well region 182 extends into region 160 to depth less than that of first well region 180. First well region 180 and second well region 182 form a pn junction 210 with region 160, which is the primary blocking junction for device 200 when device 200 is in an off-state or under reverse bias conditions.

A p-type high voltage region, body region, or diffused region 240 is formed in another portion of region 160 adjacent to or in proximity to well regions 180 and 182. P-type region 240 has a higher doping concentration than region 160. An n-type source region 241 and a p-type contact region 242 are formed in region 240.

First dielectric layers 310 and 311 are formed on device 200 to provide localized areas of passivation. First dielectric layers 310 and 311 comprise for example, localized oxidation of semiconductor (LOCOS) regions or field silicon oxide regions formed using conventional thermal deposition or growth techniques. By way of example, first dielectric layers 310 and 311 have a thickness on the order of 0.5 to 2.0 microns. As shown in FIG. 3, first dielectric layer 311 provides surface isolation for at least a portion of well region 180.

A gate structure 440 is formed over major surface 201 and includes a thin gate dielectric layer 441 and a gate electrode layer 442. In a typical embodiment, gate dielectric layer 441 comprises a silicon oxide, and has thickness in range from about 0.02 to about 0.1 microns. By way of example, gate electrode layer 442 comprises a doped polycrystalline semiconductor material such as a doped polysilicon.

A second dielectric layer 410 is formed over device 200 and patterned to provide a series of openings for first contact regions or layers 361, 362, and 363. By way of example, second dielectric layer 410 comprises a doped thermally deposited silicon oxide such as BPSG, PSG, or the like. Second dielectric layer 410 has thickness on the order of about 0.5 to about 1.5 microns, and is formed using conventional processing techniques.

First contact region 361 provides electrical contact or routing to source region 241 and p-type contact region 242; first contact region 362 provides electrical contact or routing to gate electrode layer 442; and first contact region 363 provides electrical contact or routing to drain region 190. By way of example, first contact regions 361, 362, and 363 comprise titanium, tungsten, titanium silicide, tungsten silicide, aluminum, aluminum alloys (e.g., AlSi, AlCu), combinations thereof, or the like. A third dielectric layer 411 is formed over first contact regions 361-363, and comprises for example, silicon nitride or a thermally deposited silicon oxide. In one embodiment, third dielectric layer 411 comprises a low temperature oxide, has thickness on the order of about 0.2 to about 0.5 microns, and is formed using conventional processing techniques.

In accordance with the present invention, a charge stabilization, charge neutralizing layer, or glass stabilization layer 330 is formed over major surface 201 to stabilize the surface charge formed adjacent well region 180 when junction 210 of device 200 is in a blocking mode, reverse bias condition, or an off state. In one embodiment, charge stabilization layer 330 extends at least over the extent or edges of first dielectric layer 311. In another embodiment, charge stabilization layer 330 extends continuously across major surface 201 as shown in FIG. 3, except for those areas where vias or openings (not shown) are formed for connecting to a next level of metallization. In a typical embodiment, charge stabilization layer 330 comprises a material having a lower dielectric constant than first dielectric layer 311. For example, charge stabilization layer 330 comprises a silicon glass material that contains a greater amount of SiH content or concentration than the SiH content or concentration in first dielectric layer 311. In one embodiment, charge compensation layer 330 has a refractive index less than about 1.4. In a further embodiment, charge compensation layer 330 has a refractive index between about 1.36 and about 1.38. By way of further example, charge stabilization layer 330 comprises a silicon glass layer having an O—Si—O lattice that is more fragmented or cage like than conventional thermally deposited or thermally grown silicon oxides, which are more network like. In a still further example, charge stabilization layer 330 comprises a silicon glass material that is more porous than conventional thermally deposited or grown silicon oxides. In one embodiment, charge stabilization layer 330 comprises a liquid or flowable glass material such as a siloxane, silicate, or hydrogen silsesquioxanes (HSQ) spin-on glass (SOG) or the like. By way of example, charge stabilization layer 330 has thickness in range from about 0.3 to about 0.6 microns. In the present invention, charge stabilization layer 330 does not consist of silicon nitride or semi-insulating polysilicon (SIPOS).

A fourth dielectric layer 412 is formed over charge stabilization layer 330. In one embodiment, vias or openings (not shown) are formed before fourth dielectric layer 412 is formed so that fourth dielectric layer 412 also lines the walls of the vias. Fourth dielectric layer 412 comprises for example, a low temperature silicon oxide layer, and has thickness on the order of about 0.3 to about 0.7 microns. Next, second contact regions 461, 462, and 463 are formed over major surface 201 and provide contact or routing to first contact regions 361, 362, and 363. By way of example, second contact regions 461-463 comprise titanium, tungsten, titanium silicide, tungsten silicide, aluminum, aluminum alloys (e.g., AlSi, AlCu), combinations thereof, or the like. In one embodiment, a final passivation layer 413 is formed over major surface 201 to provide isolation and/or protection of second contact regions 461-463 except where final contact will be made.

The inventors of the present invention found that charge compensation layer 330 functions to neutralize or reduce the dipole effect or stabilize surface charge effects found within first dielectric layer 311 under high voltage reverse bias conditions thereby improving the stability of the breakdown voltage of device 200. For example, when a device 200 designed for 700 volts was compared to a conventional 700 volt LDMOS device using a conventional thermally deposited silicon oxide (e.g., a tetraethylorthosilicate (TEOS) oxide) layer instead of a charge stabilization layer 330, the inventors unpredictably and unexpectantly found about an 85% improvement in breakdown voltage stability during high voltage stress testing.

Figure 4:
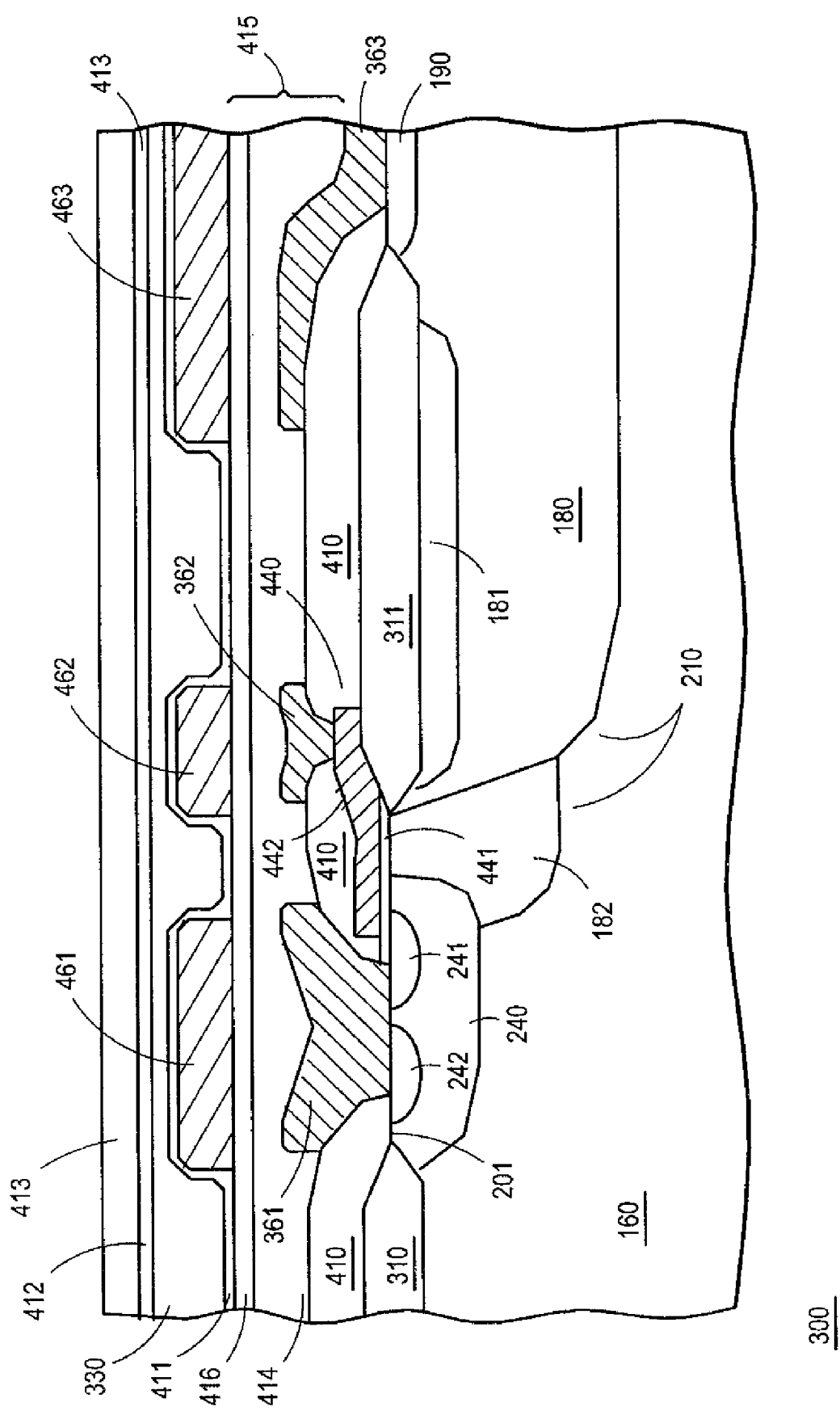
FIG. 4 illustrates a highly enlarged cross-sectional view of a high voltage semiconductor structure in accordance with a still further embodiment of the present invention.

FIG. 4 shows a highly enlarged cross-sectional view of a power semiconductor device, high voltage structure, or high voltage power device 300 in accordance with a still further embodiment of the present invention. Device 300 is similar to device 200 except that charge stabilization, charge neutralizing layer, or glass stabilization layer 330 is formed over second contact regions 461-463. Also in this embodiment, an ILD region 415 separates first contact regions 361-363 from second contact regions 461-463, and comprises for example, first and second layers 414 and 416 of a thermally deposited oxide such as a silicon oxide deposited using TEOS.

Like device 200, the inventors unpredictably and unexpectantly found that device 300 showed about an 85% improvement in breakdown voltage stability during high voltage stress testing compared to a conventional 700 volt LDMOS device using a thermally doped oxide instead of charge stabilization layer 330.

In view of all the above, it is evident that a novel device and a method of forming the device is disclosed. Included, among other features, is a high voltage power semiconductor device with a charge stabilization layer that enhances performance under high voltage reverse bias conditions.

Although the invention has been described and illustrated with reference to specific embodiments thereof, it is not intended that the invention be limited to these illustrative embodiments. For example, additional passivation layers or mutltiple charge stabilization layers may be incorporated. Also, other termination structures may be incorporated such as filled trench regions (e.g., filled with a dielectric and/or a conductive material), additional floating rings of various conductivity types, SIPOS field shaping layers, and/or metallized rings. Those skilled in the art will recognize that modifica-

We claim:

1. A method for enhancing breakdown voltage stability in a high voltage semiconductor device comprising the steps of:
providing a body of semiconductor material of a first conductivity type and having a resistivity greater than or equal to about one ohm-cm, wherein the body of semiconductor material has a first major surface;
forming a first dielectric layer in proximity to the first major surface;
forming a first doped region of a second conductivity type in the body of semiconductor material, wherein the first doped region and the first dielectric layer are in proximity to each other, and wherein the first doped region forms a high voltage junction with the body of semiconductor material; and
forming a spin-on glass layer overlying the first dielectric layer, wherein the spin-on glass layer has a refractive index less than 1.4, and wherein the spin-on glass layer is configured as a charge stabilization layer that provides the enhanced breakdown voltage stability, and wherein the spin-on glass layer terminates in proximity to an edge of the first doped region without overlying the entire first doped region.

2. The method of claim 1, wherein the step of forming the spin-on glass layer comprises forming the spin-on glass layer having a refractive index in a range from about 1.36 to about 1.38.

3. The method of claim 1, wherein the step of forming the first dielectric layer comprises forming a thermally grown silicon dioxide.

4. The method of claim 1, wherein the step of forming the first dielectric layer comprises forming a thermally deposited silicon oxide.

5. The method of claim 1, further comprising the step of forming a second dielectric layer overlying the spin-on glass layer.

6. The method of claim 1, wherein the step of forming the first doped region includes forming the first doped region wherein the high voltage junction has a breakdown voltage greater than or equal to about 200 volts.

7. The method of claim 2, wherein the step of forming the spin-on glass layer comprises forming the spin-on glass layer comprising one of a siloxane spin-on glass, a silicate spin-on glass, or a hydrogen silsesguioxanes spin-on glass.

8. The method of claim 5, wherein the step of forming the second dielectric layer comprises forming a silicon nitride layer.

9. A method for forming a high voltage semiconductor device having enhanced breakdown voltage stability comprising the steps of:
providing a region of semiconductor material of a first conductivity type and having a resistivity greater than about one ohm-cm, wherein the region of semiconductor material has a first major surface;
forming a first extended drain region of a second conductivity type in the region of semiconductor material, wherein the first extended drain region forms a primary blocking junction and has a breakdown voltage greater than about 200 volts;
forming a body region of the first conductivity type in the region of semiconductor material;
forming a source region of the second conductivity type in the body region;
forming a first dielectric layer in proximity to at least a portion of the first major surface, wherein the first extended drain region and the first dielectric layer are in proximity to each other;
forming a gate structure adjacent the body region and the first extended drain region, wherein the high voltage semiconductor device is configured as an LDMOS device; and
forming a spin-on glass layer overlying the first dielectric layer, wherein the spin-on glass layer has a refractive index less than 1.4, and wherein the spin-on glass layer is configured as a charge stabilization layer that provides the enhanced breakdown voltage stability.

10. The device of claim 9 wherein the spin-on glass layer comprises a spin-on glass having a refracrive index in a range from about 1.36 to about 1.38.

11. The method of claim 9, wherein the step of forming the first dielectric layer comprises forming a thermally grown silicon dioxide.

12. The method of claim 9, wherein the step of forming the first dielectric layer comprises forming a thermally deposited silicon oxide.

13. The method of claim 9, further comprising the step of forming a second dielectric layer overlying the spin-on glass layer.

14. The method of claim 10, wherein the step forming the spin-on glass layer includes forming a spin-on glass layer comprising one of a siloxane spin-on glass, a silicate spin-on glass, or a hydrogen silsesguioxanes spin-on glass.

15. The method of claim 13, wherein the step of forming the second dielectric layer comprises forming a silicon nitride layer.

* * * * *

UNITED STATES PATENT AND TRADEMARK OFFICE
CERTIFICATE OF CORRECTION

PATENT NO. : 7,632,760 B2
APPLICATION NO. : 11/099895
DATED : December 15, 2009
INVENTOR(S) : Tu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 642 days.

Signed and Sealed this

Second Day of November, 2010

David J. Kappos
*Director of the United States Patent and Trademark Office*